United States Patent [19]

Malaviya et al.

[11] Patent Number: 4,739,252
[45] Date of Patent: Apr. 19, 1988

[54] CURRENT ATTENUATOR USEFUL IN A VERY LOW LEAKAGE CURRENT MEASURING DEVICE

[75] Inventors: Shashi D. Malaviya, Hopewell Junction; Daniel P. Morris, Purchase, both of N.Y.

[73] Assignee: International Business Machines Corporation, Armonk, N.Y.

[21] Appl. No.: 855,241

[22] Filed: Apr. 24, 1986

[51] Int. Cl.[4] .................. G01R 19/165; G01R 31/02
[52] U.S. Cl. .................. 324/115; 324/158 D; 307/549
[58] Field of Search .............. 324/115, 116, 120, 130, 324/158 R, 158 D, 158 T; 333/81 R, 18; 357/46, 36; 307/299 A, 299 B, 490, 549, 567, 286 R, 303

[56] References Cited

U.S. PATENT DOCUMENTS

| Re. 29,918 | 2/1979 | Verkuil | 324/158 |
|---|---|---|---|
| 3,702,967 | 11/1972 | McPhail | 324/158 |
| 3,795,859 | 3/1974 | Benante et al. | 324/158 T |
| 3,810,049 | 5/1974 | Krause | 333/81 R |
| 3,865,648 | 2/1975 | Custrucci et al. | 357/46 |
| 3,904,962 | 9/1975 | Olson, Jr. | 324/158 D |
| 3,952,257 | 4/1976 | Schade, Jr. | 330/288 |
| 4,055,773 | 10/1977 | Shoeff | 307/490 |
| 4,068,254 | 1/1978 | Erdi | 357/36 |
| 4,081,822 | 3/1978 | Sao et al. | 357/46 |
| 4,246,500 | 1/1981 | Okada et al. | 307/299 B |
| 4,323,795 | 4/1982 | Holloway et al. | 357/36 |

FOREIGN PATENT DOCUMENTS

| 2712369 | 9/1978 | Fed. Rep. of Germany | 307/299 B |
|---|---|---|---|
| 0033566 | 4/1981 | Japan | 324/158 D |
| 0065014 | 4/1982 | Japan | 330/284 |

OTHER PUBLICATIONS

"Picoampere Current Sounce and Measuring Circuit", by Hohl et al., IBM Tech. Disc. Bull., pp. 1017-1018, 9/75, vol. 18, #4.

Primary Examiner—Reinhard J. Eisenzopf
Assistant Examiner—W. Burns
Attorney, Agent, or Firm—John D. Crane

[57] ABSTRACT

An attenuator useful in measuring low level leakage currents is disclosed. The attenuator includes a plurality of current dividers coupled in cascade. Each current divider includes an input and two outputs between which the current entering the input is divided. The current exiting the last divider is significantly attenuated from that entering the attenuator. The attenuator output is coupled to the device under test and to one input of a differential amplifier. A known current is input to the differential amplifier and part is directed to the attenuator input and the other part to a current measuring device. The difference between the known current input to the differential amplifier and that measured is the current input to the attenuator. In the steady state, the current input to the differential amplifier from the current attenuator is about zero. Accordingly, the leakage current is equal to the known current entering the differential amplifier less the measured current divided by m, the attenuation provided by the attenuator.

24 Claims, 2 Drawing Sheets

CURRENT ATTENUATOR USEFUL IN A VERY LOW LEAKAGE CURRENT MEASURING DEVICE

FIELD OF THE INVENTION

This invention relates to an attenuator useful in a current measuring circuit and more particularly to a precision current attenuator useable in a current measuring device which can extend the practical testing range of current measuring devices used in automatic testers from the microampere range to the picoampere range.

BACKGROUND OF THE INVENTION

In the semiconductor fabrication art, there is an increasing necessity for devices which have very low leakage currents in both logic and in memory circuits. The increased density of both logic and memory chips has produced the consequent need to maintain these chips at a level of power dissipation which can be cooled economically. This requires the circuits used to have a low power dissipation. Such lower power circuits are generally achieved by designing circuits to operate at currents lower than previous generation circuits. This low operating current requirement, however, makes it necessary to measure more accurately the distribution of discrete device leakage currents both in the forward and in the reverse mode of operation as the leakage current can be large enough to adversely affect circuit operation.

In the field of semiconductor device design and manufacture, such devices must be tested to determine whether their electrical parameters meet design specifications or to determine whether the device has defects. Semiconductor circuits are designed assuming that the electrical characteristics of the component devices will fall within certain specified ranges. When a device characteristic deviates from this assumed specification, however, the circuit will fail. With the increased density of both semiconductor logic and memory chips, the need to maintain chip power dissipation within a range which can be economically cooled requires circuits that are designed to operate at very low power dissipation levels. For example, for a high density semiconductor memory chip to maintain low chip power dissipation, it is desirable that all memory cells on the chip which are in standby condition, that is in the condition when data is neither being written into nor read therefrom, should consume the minimum power which the semiconductor design will allow. To achieve this, the memory cells are designed so that the standby currents are the minimum necessary to retain data stored therein. This results in a cell being sensitive to low level currents at cell nodes to which devices at low forward bias and reverse bias are connected. If these low level currents exceed the limits assumed in the design, the cell will fail. Such failures can substantially reduce the number of functional chips yielded by the manufacturing process.

A VLSI semiconductor chip contains hundreds of thousands of devices. When such a chip must operate at low power, it is essential that the discrete device leakage current distribution be accurately known. This is necessary so that the circuits can be designed to tolerate the worst case leakage which can occur.

One type of device for which leakage current is desired to be measured is the Schottky barrier diode (SBD) which is commonly used in both logic and memory circuits. A Schottky barrier diode is typically formed by depositing a metal over an etched opening in the top insulating layer of the semiconductor wafer. Although the mean leakage current of such a device is in the sub-pico ampere range, the upper bound of the leakage current distribution can be considerably higher, e.g., in the nanoampere range. To obtain an accurate determination of the upper bound of the leakage current for Schottky barrier diodes on a chip, a large number of discrete devices must be measured. This measurement must be periodically done during high volume manufacture of the chip so that if the upper bound increases, corrective action can be taken to reduce leakage and maintain the desired level of manufacturing yield.

High volume manufactured semiconductor chips are typically tested by automatic electrical testers which step probes from chip site to chip site over the semiconductor wafer. The measured data is automatically sent to and stored in a host computer. Such testers can measure currents accurately in the micro ampere range and possibly down to 100 nanoampere but not in the sub-nanoampere range. Therefore, such currently available testers cannot be used to measure the upper bound of a leakage current distribution in a discrete device such as a Schottky barrier diode. Using other measurement techniques to measure this distribution upper bound of leakage current for a Schottky barrier diode, however, is not sufficiently fast so as to be suitable for use in a high volume manufacturing environment. Accordingly, the prior art testers and methods do not provide any means for measuring leakage current in the sub-nanoampere range in a high volume manufacturing environment for semiconductor devices.

Various devices are known in the prior art for measuring low currents. For example, a circuit for doing so is described and claimed in the patent of McPhail, U.S. Pat. No. 3,702,967 entitled "Electronic Test System Operable in Two Modes". This patent describes a circuit making a parametric test system that can provide a forcing current at a predetermined level in one mode with a voltage being measured or a forcing voltage of a constant potential in another mode with a current being measured. The circuit does not provide any means to extend the range of conventional automatic testers to measure leakage currents in the sub-nanoampere range.

Another circuit for measuring P-N junction device leakage is described and claimed in the patent of Verkuil, U.S. Pat. No. Re. 29,918 entitled "Contactless LSI Junction Leakage Testing Method", reissued on Feb. 20, 1979. This patent describes a circuit for contactless measuring P-N junction leakage currents by inductively coupling high frequency oscillations to a semiconductor specimen which is simultaneously subjected to a pulsed light of selected intensity. The described circuit does not measure discrete device leakage current in response to a fixed applied DC voltage nor does it measure currents in the sub-nanoampere range.

Typical low current measuring devices used in the laboratory may be used to measure currents in the picoampere range. These measuring devices when used to measure low currents in a circuit on a chip are quite difficult to use because the probe capacitance and the like cause the device to respond very slowly. Hence, this approach is not suitable for use in a manufacturing testing environment where such current measurements have to be made quickly and accurately.

BRIEF DESCRIPTION OF THE INVENTION

It is a principle object of the present invention to provide means for extending the current measuring range of conventional automatic semiconductor device testers to the picoampere range.

It is another object of the present invention to provide a current measuring circuit operative in the picoampere range which utilizes a circuit that can be integrated with the semiconductor device under test without requiring an additional or special process steps.

It is another principle object of the present invention to provide a current attenuator circuit for very accurately attenuating an input current thereto by an exact amount.

The current invention comprises a specially designed current attenuator with extremely low leakage currents. The attenuator, in its intended use in a precision low current measuring device is coupled to the device under test and to a differential amplifier. The differential amplifier output is utilized by a conventional current measuring device to measure the current therethrough which is related to the current passing through the device under test by the amount of attenuation provided by the attenuator.

The attenuator of the present invention includes a plurality of stages coupled in cascade. Each stage includes an input terminal for receiving current and an output terminal. Disposed between the input and output terminals is a specially designed current divider means which divides the input current thereto into n known parts where n is an integer greater than or equal to 2. Coupling means are provided to couple m of the known current parts to the stage output where m is a number greater than or equal to 1 and less than or equal to n−1. By expeditiously selecting the number n and m, and the number of attenuator stages, it is a possible to attenuate the current input to the the stage by a selected amount.

In an application for the current attenuator of the present invention, a device or circuit under test is coupled to the output of the attenuator. A differential amplifier is also coupled to the attenuator output. The differential amplifier itself has an output which couples to the input of the attenuator. In the steady state, the differential amplifier provides an input current to the attenuator which is attenuated by a known amount and becomes, at its output, a current equal to the current which is intended to be measured such as the leakage current through a Schottky barrier diode. Because the current provided by the differential amplifier is many orders of magnitude larger than the leakage current, the current passing through the differential amplifier can be measured by conventional current measuring apparatus with the actual leakage current being determined by dividing the measured current by the amount of attenuation provided by the attenuator circuit.

The circuits utilized in the attenuator and the differential amplifier of the current measuring devices according to the present invention include semiconductor elements consisting only of PN junctions to form PNP transistors and two P-channel insulated gate field effect transistors (PFETs). The PN junctions are formed from the base-collector junctions of a conventional vertical NPN bipolar transistor. The emitter-base P-N junction of such transistor is not used as the leakage current can be unacceptably high. Each PFET is made of a metal gate over an N-region between two P-base regions of a conventional NPN transistor. Accordingly, the current measuring circuit of the present invention can be manufactured using a conventional bipolar process without the need for any additional process steps.

BRIEF DESCRIPTION OF THE DRAWINGS

The foregoing and other objects, advantages and features of the present invention are described hereinafter in greater detail in connection with the drawings which form a part of the disclosure wherein.

DETAILED DESCRIPTION

Figure 1:
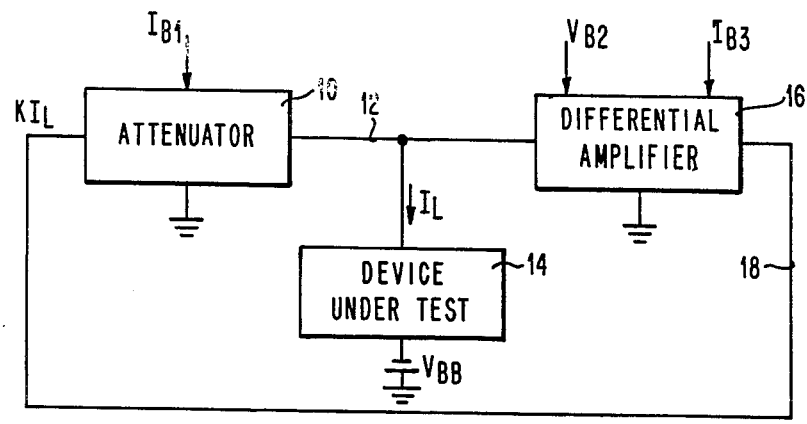
FIG. 1 is a functional block diagram of the attenuator circuit of the present invention in a configuration for measuring leakage current in the picoampere range.
Figure 2:
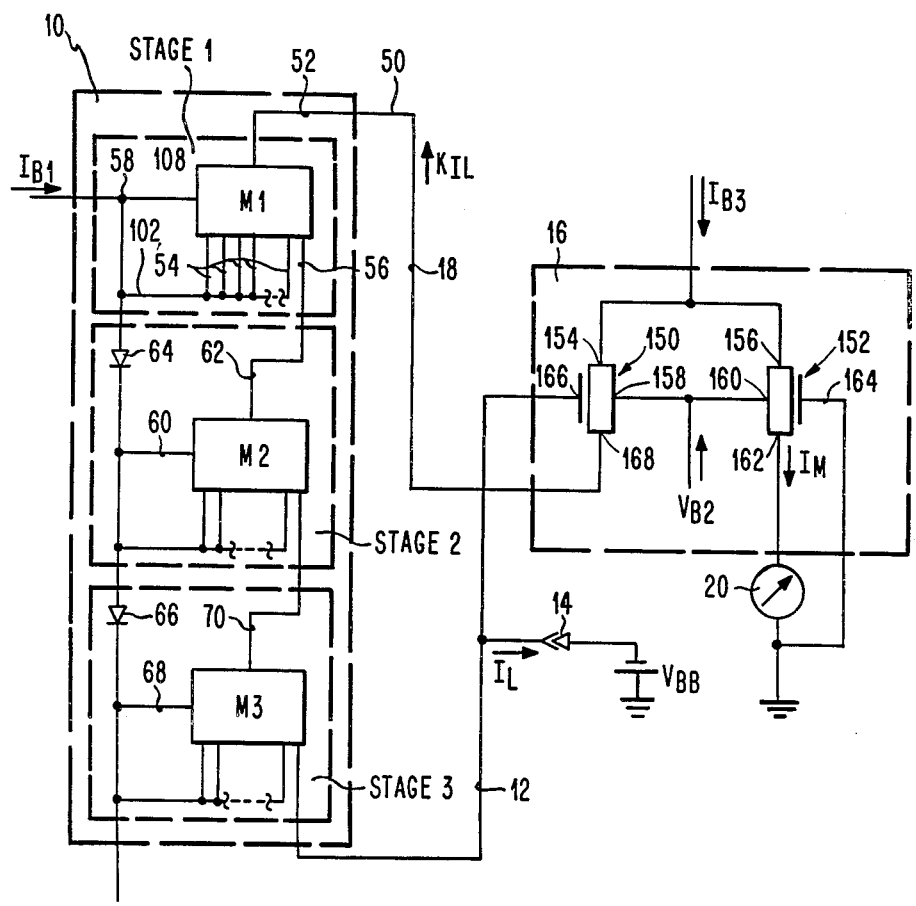
FIG. 2 is a more detailed functional block diagram of the attenuator of the present invention.

Referring now to FIG. 1, the attenuator circuit of the present invention is illustrated in block diagram fashion in a configuration utilized for measuring currents in the picoampere range. The current measuring circuit includes the attenuator 10 which has a bias current input thereto as indicated by the arrow $I_{B1}$. The output of the attenuator 10 is coupled by the wire 12 to the circuit or device under test 14 and also an input to the differential amplifier 16. In the steady state, however, no current from the attenuator over the line 12 enters the differential amplifier 16 and, accordingly, the entire current output from the attenuator 10 comprises the leakage current $I_L$ flowing through the device under test 14. As illustrated in FIG. 2, a bias supply $V_{BB}$ is provided to assure that there is a bias across the device or circuit under test 14 so that some leakage current will pass therethrough. The supply $V_{BB}$ is typically in the range of about 1 to 10 volts or even higher or lower depending on the device under test.

The differential amplifier 16 has two biasing supplies coupled thereto, namely $V_{B2}$ and $I_{B3}$. The differential amplifier 16 also has an output lead 18 which couples to one input to the attenuator 10. The current flowing through the line 18 in the steady state is $KI_L$ where K is a number greater than 1 and in the preferred embodiment of the present invention, $K=10^5$. Accordingly, a current in the order of magnitude of $KI_L$ passes through the microammeter 20 and, therefore, the leakage current $I_L$ can be calculated from the equation $I_L = (I_{B3} - I_M)/K$.

FIG. 2 shows a schematic diagram of the circuit of FIG. 1 and more particularly shows the circuit components which are utilized for the attenuator 10. As illustrated in FIG. 2, the attenuator has 3 attenuator stages namely, stage 1, stage 2 and stage 3. This will produce an attenuation of $10^{-3}$. While 3 stages of the attenuator are illustrated in FIG. 2, it will be understood by those of skill in the art that more or fewer such stages may be utilized and, as will become clearer, the attenuation achieved by the attenuator 10 is a function of the number of stages in the attenuator and the amount of current division achieved by each attenuator stage.

Each attehuator stage includes an input terminal which, for stage 1, is located at point 50. Each stage also includes a current divider means which, for stage 1, is designated M1. The input terminal 50 is connected to the current divider means M1 by a connector lead 52. The current divider means M1 includes a plurality of intermediate output terminals 54 which are all coupled together. A further intermediate output terminal 56 is not coupled to the other intermediate output terminals but is coupled to the input terminal to the next stage of the attenuator 10. The current attenuator means M1 is designed in such a fashion that the current input thereto through the lead 52 is divided into n equal or known number of parts where n comprises the number of intermediate output terminals from the current divider means M1. In the preferred embodiment, the current divider means M1 includes 10 intermediate output terminals and, accordingly, the current entering the current divider means via lead 52 is divided into 10 equal parts. The current attenuator first stage, accordingly, has maximum attenuation when only 1 of the intermediate output terminals is connected to the input of the next attenuator stage. In the present circuit as illustrated in FIG. 2, therefore, the current passing through the output terminal 56 and comprising the input to stage 2 is one-tenth of the current entering via the connector lead 52 into stage 1. This is true because the current divider means M1 includes 10 intermediate output terminals, although, for ease of illustration, only 6 such intermediate output terminals are illustrated.

The second attenuator stage includes a current divider means M2 which is functionally the same as M1 and it also divides the current input thereto into n equal or known number of parts with one such part being directed to the input of a third attenuator stage. The third attenuator stage includes a current divider means M3 which is functionally the same as M1 and also divides the current input thereto into n equal or known number parts. As the third stage comprises the last stage for the illustrated embodiment, one of the intermediate outputs from the current divider means M3 comprises the output of the current attenuator 10 and is coupled to the line 12 which in turn couples to the device under test 14 and to an input to the differential amplifier 16. It should be noted that the number n of intermediate output terminals in each stage can be different from the number of intermediate output terminals in each other stage.

In accordance with the operation of the circuitry of FIG. 1 where n=10 and the current in each intermediate output is equal to that in each other intermediate output in each stage, the current attenuator 10 attenuates the current input thereto by 1,000. Accordingly, as the current input to the attenuator is $KI_L$, the output current in the lead 12 is $KI_L/1,000$. In the event that additional attenuation is desired for the attenuator 10, additional attenuation stages can be coupled in cascade to each other to achieve this result. In fact, coupling identical stages to the attenuator of FIG. 2 will add a further attenuation of 10 for each additional stage added. Therefore, if an attenuation of $10^{-5}$ is desired, the attenuator 10 should include 5 stages of the type illustrated in FIG. 2. Alternatively, attenuation can be changed in each stage by changing the number of intermediate outputs therein thereby changing the attenuation of the whole attenuator 10.

A bias current $I_{B1}$ is applied to the circuit of FIG. 2 as illustrated. The bias current for the preferred embodiment of the invention is in the order of 10 microamperes and this bias establishes an equal voltage drop across each of the attenuator stages M1, M2 and M3, ie., the voltage between the stage input and each intermediate output terminal that is coupled to another intermediate output terminal. To produce the voltage drop between the lead 60 and the input terminal 62 of stage 2, a diode 64 is coupled between the point 58 and the lead 60 which produces a further voltage drop in the range of between about 0.7 and 0.8 volts. As such, the voltage at the lead 60 is approximately between 0.7 and 0.8 volts below the voltage at the input terminal 62. In a similar fashion, a further diode 66 is coupled between lead 60 and the lead 68 to thereby establish the voltage at lead 68 at between about 0.7 and 0.8 volts below the voltage at the input terminal 70 to stage 3 of the attenuator 10.

Figure 3:
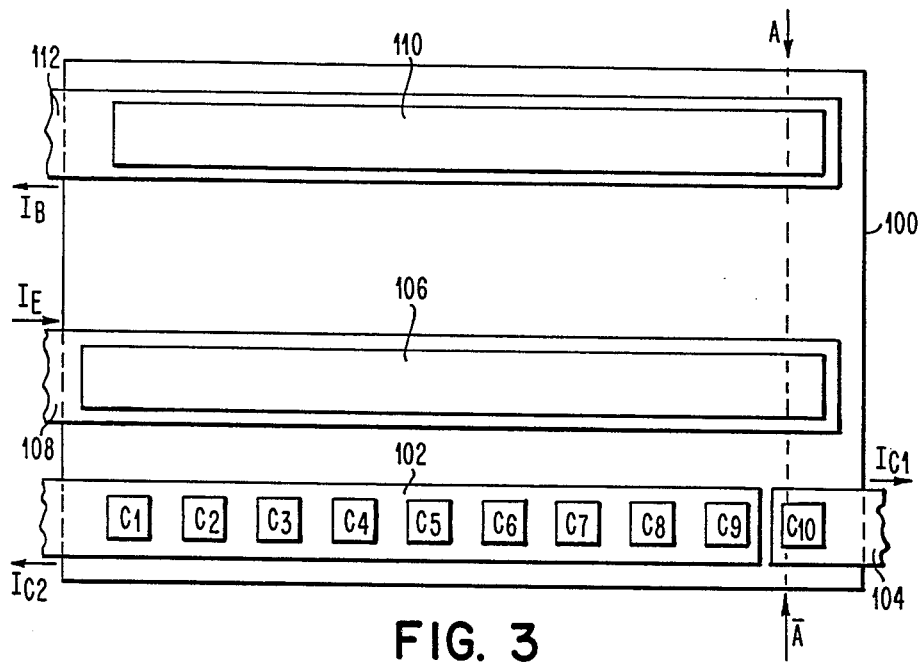
FIG. 3 illustrates the physical layout of the semiconductor current divider element utilized in each stage of the attenuator of the present invention.
Figure 4:
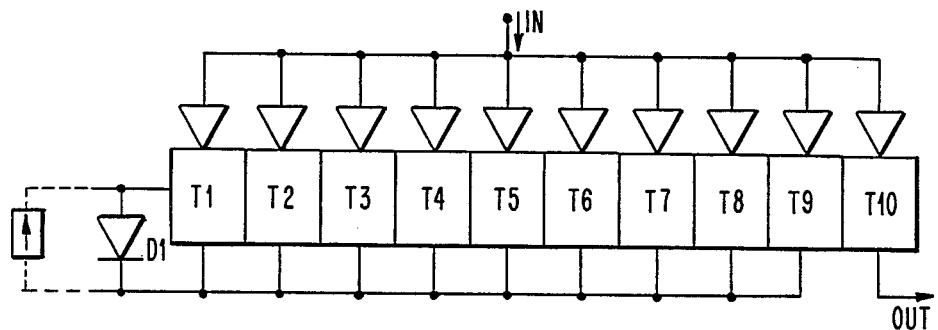
FIG. 4 illustrates the equivalent circuit diagram for the semiconductor current divider element of each attenuator stage.
Figure 5:
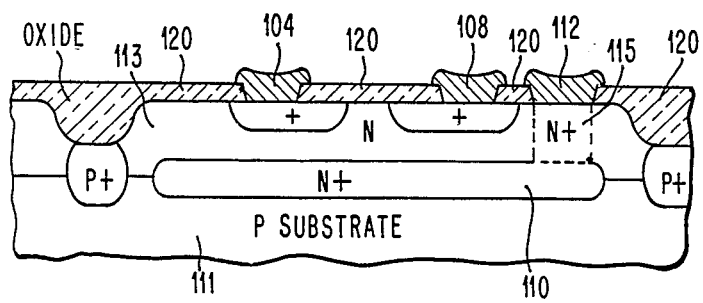
FIG. 5 is a sectional view through one of the PNP transistors of FIG. 3, taken along section line A—A.

Each of the current attenuator means M1, M2 and M3 of FIG. 2 are constructed in a manner illustrated by FIGS. 3 and 5 and has an equivalent circuit as illustrated in FIG. 4. The transistors T1–T10 are PNP transistors which are typically, in bipolar technologies, the lowest leakage transistors available. The transistors T1–T10 and the diode D1 are of the same conductivity type and are to be considered active bipolar integrated circuit elements as that term is used in the claims.

Referring now to FIG. 2, the circuit diagram of a current attenuator according to the present invention is shown and includes 3 stages. Each stage of the attenuator is made up of 10 lateral PNP transistors shown in its equivalent form in FIG. 4 as T1 through T10. Each PNP transistor is of the same design and physical configuration and is formed in a single isolation region 100 as illustrated in FIG. 3. There are 10 separate collectors which are formed by the ten separate P regions labelled $C_1$–$C_{10}$. Each such collector $C_1$–$C_{10}$ comprises an intermediate output terminal from a current divider. Each P region which forms a PNP collector has the same physical dimensions as each other P region collector and there is a fixed separation between adjacent collectors. This is done to assure that the current passing through each of the collectors is the same as the current passing through each of the other collectors. The nine collectors $C_1$–$C_9$ are connected in common by a metal line 102 and form a common collector of the current divider. The tenth collector is brought out separately via a metal line 104 which comprises a stage output terminal. The particular collectors which are selected to be coupled together is not critical as any nine collectors could have been selected. For ease of electrical connection, however, it is expedient to couple nine adjacent collectors to the metal line 102 and the remaining collector to the line 104. It will also be recognized by those of skill in the art that a total of ten such collectors need not be employed in every instance. In fact, the number of collectors could be more than or fewer than ten as desired. By having ten collectors, however, this makes it easier to provide a current attenuator having an output current which is ten times smaller than the input current. Those of skill in the art will also recognize that it is equally possible to couple more than one of the collectors to the stage output terminal and the remaining collectors of a stage to the common collector. In this way the attenuation becomes M/N where M is the number of collectors coupled to the stage output terminal and N is the number of collectors in the stage.

In the configuration illustrated in FIG. 3, there are 10 emitters which comprise a common emitter formed, in the preferred embodiment, by a single P+ region 106 which is brought out of the chip via a metal line 108.

The configuration also includes a common base 110 which is brought out of the chip via metal line 112.

Referring now to FIG. 5 which illustrates the fabrication of the device as taken along section line A—A of FIG. 3, the device is manufactured on a P substrate material. At the outset, a subcollector region 110 having a doping of N+ is either diffused or implanted into the surface of the P substrate 111. Thereafter, an N doped region 113 is formed over the substrate 110 with the N+ region therein by means of, for example, epitaxial deposition. Due to subsequent processing and heat, the N+ region, which originally was formed in the P substrate 111, diffuses into the epitaxially deposited N region 113 so that it ultimately occupies the horizontally disposed N+ region such as that labelled 110 in FIG. 5.

After the N region 113 has been deposited by epitaxial deposition, for example, a vertically disposed N+ region 115 is formed either by diffusion or by implantation to thereby form a continuous N+ doped region to which a metal connector lead 112 can be attached. The N+ region thus formed comprises a means to connect to the base region 113. As such, the connector lead 112 comprises the base contact to the PNP transistor illustrated in FIG. 5.

The collector $C_{10}$ comprises a P region which has been either diffused or implanted into the N region 113. The emitter 106 also comprises a P doped region which is either diffused or implanted into the N region 113. The collector $C_{10}$ is electrically connected by a metal conductor lead 104 and the emitter 106 is connected by a metal connector 108. The metal connectors 104, 108 and 112 provide a means for electrically connecting the PNP transistor to other circuits.

An insulating layer 120 is formed on the surface of the N region 113 to provide insulation between the electrical connector leads 104, 108 and 112 and to protect the substrate. The insulator layer 120 preferably comprises an oxide layer such as silicon dioxide, and a layer over that of silicon nitride although other insulating materials might also be utilized.

Those of skill in the art will recognize that the order of the manufacturing steps for producing the device illustrated in FIG. 5 is not critical. For example, once the epitaxially deposited N region 113 has been formed, the insulating layer 120 could thereafter be formed on top of it. Thereafter, by appropriate etching and either diffusion or implantation, the collector and emitters can be formed. The N+ region 115 for connecting to the N+ region 110 which is formed at the junction between the P doped substrate 111 and the epitaxially deposited N region 113 can be deposited as a doped epitaxial layer or deposited and subsequently doped by diffusion or implantation. The connector leads can thereafter be formed.

The current divider illustrated in FIG. 3 operates in the following manner. A current $I_E$ is forced into the common emitter 106. Since each PNP transistor is identical, the current in each PNP collector is virtually equal as well. Since the PNP base current $I_B$ is generally much less than the total collector current which is the sum of the currents in the ten PNP collectors, the total collector current is about equal to the emitter current $I_E$. For the base current $I_B$ to be much less than the total collector current, the PNP transistor must have a high beta, which generally is the case when the emitter current is below the onset of high level injection effects. The collector current $I_C$ of a PNP transistor is related to its emitter current $I_E$ by the equation $I_C$ equals $I_E/(1+1/B)$ where B is the value of beta for the particular PNP transistor. For a beta of approximately 50, the collector current is approximately 98% of the emitter current. A PNP beta of 50 and higher can readily be achieved with currently available semiconductor processing, especially at low dc currents.

In the current divider of FIG. 3, since each PNP collector has identical dimensions, the total collector current divides equally between each collector $C_1$-$C_{10}$. Therefore, the collector current $I_{C1}$ in the single collector $C_{10}$ is 1/10th the total collector current.

The total collector current is equal to $I_E/(1+1/B)$ where $I_E$ is the current in the emitter 106. Therefore, the current $I_{C1}$ is a fraction of the emitter current $I_E$ where the fraction is given by $1/(10*(1+1/B))$.

The use of more than one current divider of the type illustrated in FIG. 3 in the circuit of FIG. 2 which is the preferred embodiment of the invention will now be described. The circuit of FIG. 2 includes three current dividers coupled in cascade. A ten microampere bias current will flow through the diodes 64 and 66 to ground. If some current, on the other hand, flows into the input terminal 50 of the current attenuator, current will flow in each common emitter of each current divider stage which results in each current divider drawing a small base current that flows out of the common base terminal of each current divider. In practice, sufficient current is forced into the terminal 58 to forward bias each PN diode with a voltage of approximately 0.7 volts. Voltage drops of 0.7 volts across the diodes obviously provides proper dc biasing conditions for the PNP transistors in the current dividers.

The differential amplifier 16 of FIG. 2 includes two high gain P channel insulated gate field effect transistors (PFET) 150 and 152. A PFET, as is commonly known in the art, can be fabricated using the same P diffusions or implants used to form the emitter and collector of the PNP transistors of the current divider stages or they can be formed using a different P diffusion or implantation.

The electrical characteristics of the PFET transistors 150 and 152 should be matched as closely as possible. This can be accomplished if both PFET 150 and 152 have the same physical dimensions and if they are both laid out on the silicon chip next to each other.

The two PFET transistors 150 and 152 are connected as illustrated in FIG. 2. The source 154 of PFET 150 is connected to the source 156 of PFET 152. The substrate 158 of PFET 150 is connected to the substrate 160 of PFET 152. The drain 162 of PFET 152 is connected to a test pad and comprises a test terminal to which a microammeter 20 is connected. The other terminal of the microammeter 20 is coupled to ground. The gate 164 is also coupled to ground. The gate 166 of PFET 150 is connected via the lead 12 to the output terminal of the attenuator 10 which comprises a single collector of the stage 3 in the attenuator in the illustrated embodiment. The device under test 14 is also coupled to the lead 12. The drain 168 of the PFET 150 is coupled by the lead 18 to the input terminal 50 of the attenuator 10.

The differential amplifier operates in the following manner. A dc current, for example 10 microamperes, is forced into the lead coupling between the sources 154 and 156 and comprises the bias current labeled $I_{B3}$. The differential amplifier steers the current partly into the drain 168 of PFET 150 and the rest goes to the drain 162 of PFET 152. The current flowing out of the drain of PFET 150 supplies the input current to the current attenuator and is labeled $KI_L$. The current flowing out of the drain of PFET 152 goes to ground via the microammeter 20. Whether current flows out of the drain of PFET 150 or 152 depends on the relative potentials of the gates 166 and 164, the latter of which is held at ground potential. If the gate 166 were also at ground potential, the current forced into the two sources 154 and 156 would divide equally between the two PFETs 150 and 152. In general during actual operation of the circuit, the voltage on the gate 166 will be different from ground potential and this difference will cause a change in the current flowing out of the drain 168 as compared to that flowing out of the drain 162.

The current attenuator operates in conjunction with the differential amplifier to measure device leakage current in the following manner. In the steady state, no current flows into or out of the gate 166 of PFET 150. Consequently, any current flowing in the lead 12 corresponds to the leakage current through the device under test 14. As has already been pointed out, the current flowing from the drain 168 to the attenuator is equal to $KI_L$ where K is the attenuation of the current attenuator according to the present invention. As the attenuator of FIG. 2 is designed to produce an output current which is one-thousand times smaller than its input current, the value of K for this circuit is one-thousand.

As the bias current $I_{B3}$ is a known current and the current flowing from the drain 162 is measured by a microammeter 20, the current in the drain 168 can thereby be calculated and is equal to $I_{B3}$ minus the measured current $I_M$. This current, in turn, is equal to a current which is one-thousand times greater, for the illustrated configuration, than the leakage current of the device under test 14. As this leakage current may be very small which is the case for, for example, Schottky barrier diodes, it may prove necessary to have a current attenuator 10 having more stages than the circuit illustrated in FIG. 2. In the experience of the inventors of the present invention, five such stages as has been illustrated appear to be suitable for measuring the leakage current of Schottky barrier diodes where the circuit illustrated in FIG. 2 also has a bias current $I_{B3}$ equal to 10 microamperes and a bias current $I_{B1}$ equal to 10 microamperes. The substrate bias $V_{B2}$ is sufficient to maintain the source and drain of each PFET 150 and 152 reverse biased with respect to their respective substrate 158 and 160.

While the foregoing description of the present invention has made particular emphasis on a given implementation of the invention and a use therefor, those of skill in the art will readily recognize that various modifications may be made to the circuitry herein described or to the uses for the described circuitry without departing from the spirit and scope of the present invention as defined by the following claims. For example, the invention can be used as a means to force a small known current through a device under test. Other uses may also be devised.

What is claimed is:

1. An integrated circuit current attenuator for precisely attenuating a current input thereto comprising, in combination:

a plurality of attenuator stages coupled in cascade, each stage comprising:

a stage input terminal for receiving the current I input to said attenuator stage:

current divider means comprising only low leakage active bipolar integrated circuit elements of the same conductivity type coupled to said input terminal to divide said current I entering into said input terminal into n equal current paths, where n is an integer greater than 2, each said current path passing through one of n intermediate output terminals from said current divider means;

means coupling m of said intermediate output terminals to a stage output terminal where m is an integer greater than or equal to 1 and less than or equal to n−1;

the stage input to the first of said plurality of cascade coupled attenuators comprises the input to said current attenuator and the stage input to each other stage is coupled to the stage output of the preceding stage; and the stage output of the last of said plurality of said cascade coupled attenuators comprises the output of the current attenuator.

2. The current attenuator of claim 1 wherein each said current divider means comprises:

a semiconductor element having at least one emitter coupled to said stage input terminal, at least one base and n collectors each comprising an intermediate output terminal, m of said collectors being coupled to said stage output terminal and said remaining collectors being coupled to said base.

3. The current attenuator of claim 2 additionally including means to maintain each said base at a voltage of about 0.8 volts different from said emitter adjacent thereto in a polarity relationship to permit conduction between said emitter and said collectors.

4. The current attenuator of claim 1 wherein n is 10 and m is 1.

5. The current attenuator of claim 1 wherein said current divider means comprises:

a semiconductor substrate of one conductivity type with a layer of a second conductivity type formed thereon, a plurality of collector regions ano at least one emitter region of said one conductivity type being formed in said layer, each said collector region comprising an intermediate output terminal and all of said emitter regions comprising, when coupled together, said stage input terminal.

6. The current attenuator of claim 5 wherein said layer of second conductivity type comprises a base region and a region of higher doping is formed between said base region and said substrate which comprises a sub-base region.

7. The current attenuator of claim 5 wherein said layer of second conductivity type comprises a base formed of an N-type semiconductor material and a sub-base region is formed of a more heavily doped n-type material, said sub-base region being shaped to provide a means to electrically connect to said sub-base region.

8. The current attenuator of claim 7 wherein said collector region and said emitter region are formed of a P-type semiconductor.

9. The current attenuator of claim 1 wherein each said current path is substantially identical to each other said current path and has I/n passing therethrough.

10. A current measuring apparatus for measuring a current passing through a device under test comprising, in combination:

a plurality of attenuator stages coupled in cascade, each stage comprising:

a stage input terminal for receiving a current I input to said attenuator stage;

current divider means coupled to said input terminal to divide said current I entering into said input terminal into n equal current paths, where n is an integer greater than 2, each said current path passing through one of n intermediate output terminals;

means coupling m of said intermediate output terminals to a stage output terminal where m is an integer greater than or equal to 1 and less than or equal to n−2;

the stage input to the first of plurality of cascade coupled attenuators comprises an input to said plurality of attenuator stages and the stage input to each other stage is coupled to the stage output of the preceding stage; and the stage output of the last of said plurality of said cascade coupled attenuators comprises an attenuator output;

said attenuator output comprises a terminal for connecting a device through which current is to be measured;

a current measuring apparatus; and a differential amplifier having a first and a second input and a bias current input thereto, said first input being coupled to said attenuator output and said second input being coupled to a reference, said differential amplifier having a first and a second output thereof, said first output being coupled to said current attenuator input and said second output being coupled to said current measuring apparatus whereby the current measured $I_M$ by said current measuring apparatus is equal to $I_{B3}-KI_L$ where $I_M$ is the measured current, $I_{B3}$ is the bias current for the differential amplifier and $KI_L$ is K times the leakage current where K is the attenuation factor of all said attenuator stages.

11. The current measuring apparatus of claim 10 wherein each said current divider means comprises:

a semiconductor element having at least one emitter coupled to said stage input terminal, at least one base and n collectors, m of said collectors being coupled to said stage output terminal and said remaining collectors being coupled to said base.

12. The current measuring apparatus of claim 11 additionally including means to maintain each said base at a voltage of about 0.8 volts different from said emitters adjacent thereto in a polarity relationship to permit conduction between said emitters and said collectors.

13. The current measuring apparatus of claim 10 wherein n is 10 and m is 1.

14. The current measuring apparatus of claim 10 wherein said current divider means includes a semiconductor element having a plurality of P-N junctions which are produced in a manner such that the leakage current through each said P-N junction is on the order of $10^{-12}$ ampere.

15. The current measuring apparatus of claim 10 wherein said current divider means comprises:

a semiconductor substrate of one conductivity type with a layer of a second conductivity type formed thereon, a plurality of collector regions and at least one emitter region of said one conductivity type being formed in said layer, each said collector region comprising an intermediate output terminal and all of said emitter regions comprising, when coupled together, said stage input terminal.

16. The current measuring apparatus of claim 15 wherein said layer of second conductivity type comprises a base region and a region of higher doping is formed between said base region and said substrate which comprises a sub-base region.

17. The current measuring apparatus of claim 15 wherein said layer of second conductivity type comprises a base formed of an N-type semiconductor material and a sub-base region is formed of a more heavily doped N-type material, said sub-base region being shaped to provide a means to electrically connect to said sub-base region.

18. The current measuring apparatus of claim 17 wherein said collector region and said emitter region are formed of a P-type semiconductor.

19. The current measuring apparatus of claim 15 wherein said emitters are coupled to said stage input terminal and m said collector regions are coupled together to form a stage output terminal.

20. The current measuring apparatus of claim 14 wherein said P-N junctions are formed in the manner of the base-collector junction of a vertical NPN bipolar transistor.

21. The current measuring apparatus of claim 10 wherein each said current path is substantially identical to each other said current path and has I/n passing therethrough.

22. An electronic test circuit for measuring a small current passing through a device under test comprising, in combination:

a differential amplifier comprising only active integrated circuit elements for steering a known current input thereto between a first differential amplifier output and a second differential amplifier output in response to a potential difference between a first differential amplifier input and a second differential amplifier input;

a current attenuator comprising only low leakage active bipolar integrated circuit elements which divides current received from said first differential amplifier output between a first attenuator output and as second attenuator output, said first attenuator output being coupled to said first differential amplifier input and also to one terminal of the device under test;

a bias supply means coupled between a second terminal of the device under test and a common terminal, said bias supply being coupled in a polarity to assure current will pass through the device under test in a pre-selected direction;

current measuring means coupled between said second differential amplifier output and said common terminal to measure a current therethrough; and means coupling said second differential amplifier input and said second attenuator output to said common terminal.

23. The electronic test circuit of claim 22 wherein said current attenuator comprises, in combination:

a plurality of current divider means connected in series beginning with a first current divider and ending with a last current divider, each current divider having an input and a first output and a second output;

the input to said first current divider comprises a current attenuator input, said first output of said last divider comprises said first attenuator output and said second output of said last divider comprises said second attenuator output; and each said current divider between said first current divider and said last current divider has its input coupled to said first output of the preceding said current divider, said second output of each said current divider being coupled to said second attenuator output.

24. The electronic test circuit of claim 23 wherein each said current divider means comprises:
   at least three PNP transistors having emitters coupled together and coupled to said current divider input, the bases of said PNP transistors being coupled together and having at least one collector coupled to said first current divider output and the remaining collectors being coupled to said second current divider output.

* * * * *